US012560913B2

(12) United States Patent
Rahman et al.

(10) Patent No.: US 12,560,913 B2
(45) Date of Patent: Feb. 24, 2026

(54) TOOL ANOMALY IDENTIFICATION DEVICE AND METHOD FOR IDENTIFYING TOOL ANOMALIES

(71) Applicant: Intel Corporation, Santa Clara, CA (US)

(72) Inventors: Mohammad Mamunur Rahman, Gilbert, AZ (US); Omesh Tickoo, Portland, OR (US); Nilesh Ahuja, Cupertino, CA (US); Ergin U Genc, Portland, OR (US); Julianne Troiano, Scottsdale, AZ (US); Ibrahima Ndiour, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 574 days.

(21) Appl. No.: 18/060,576

(22) Filed: Dec. 1, 2022

(65) Prior Publication Data

US 2024/0184274 A1      Jun. 6, 2024

(51) Int. Cl.
*G05B 19/418* (2006.01)
*H05K 3/00* (2006.01)

(52) U.S. Cl.
CPC ... *G05B 19/4184* (2013.01); *G05B 19/41885* (2013.01); *H05K 3/00* (2013.01)

(58) Field of Classification Search
CPC .......... G05B 19/4184; G05B 19/41885; G05B 19/41875; H05K 3/00; G06T 7/0004;

G06T 2207/20081; G06T 2207/20084; G06T 2207/30148; G06V 10/764; G06N 20/00; G06N 3/045; G06F 18/24
See application file for complete search history.

(56) References Cited

U.S. PATENT DOCUMENTS

| | | | | |
|---|---|---|---|---|
| 2020/0019794 A1* | 1/2020 | Engelcke | .................. | G06N 3/08 |
| 2020/0150628 A1* | 5/2020 | Vance | ................ | G05B 23/0275 |
| 2021/0042866 A1* | 2/2021 | Shanahan | ............ | G06Q 50/184 |
| 2021/0056314 A1* | 2/2021 | Thiel | ...................... | G06V 20/46 |
| 2022/0004935 A1* | 1/2022 | Lakshmanan | .......... | G06N 20/20 |
| 2022/0066435 A1* | 3/2022 | Thimmanaik | ......... | G06T 7/0006 |
| 2022/0254148 A1* | 8/2022 | Lin | .................... | G06V 10/7747 |

(Continued)

OTHER PUBLICATIONS

Ali, M., Datacamp website, "Supervised Machine Learning," published Aug. 22, 2022, downloaded from https://www.datacamp.com/blog/supervised-machine-learning.*

(Continued)

*Primary Examiner* — Eric J Yoon
(74) *Attorney, Agent, or Firm* — Viering, Jentschura & Partner mbB

(57) ABSTRACT

A method for identifying a tool anomaly of an printed circuit board (PCB) manufacturing process comprising a plurality of phases, the method comprising the steps of: obtaining image data of at least one tool of the PCB manufacturing process; inputting the image data to a machine learning module, the machine learning module configured to perform the following steps: extracting, from the image data, a tool feature image data of the at least one tool; classifying the image data into a phase of the plurality of phases; and determining, based on the classified image data and the tool feature image data, an anomaly state of the at least one tool.

18 Claims, 7 Drawing Sheets

(56) References Cited

U.S. PATENT DOCUMENTS

| | | | | |
|---|---|---|---|---|
| 2023/0125477 A1* | 4/2023 | Gurumurthy | ............ | G06N 3/08 |
| | | | | 382/103 |
| 2023/0199945 A1* | 6/2023 | Woo | ..................... | H05K 3/0052 |
| | | | | 174/254 |
| 2023/0325292 A1* | 10/2023 | Ardel | ................... | G06N 3/0455 |

OTHER PUBLICATIONS

Beiyutek Beiyu Technology website, "PCB Production Process," dated May 21, 2022, downloaded from https://www.beiyutek.com/ newsinfo/647106.html.*

Cloudflare website, "What does buffering mean? Buffering in video streaming," dated by waybackmachine Oct. 27, 2022, downloaded from https://www.cloudflare.com/learning/video/what-is-buffering/.*

* cited by examiner

510 Film cut

508 Panel moves forward

506 Air blow

502 Panel arrival

504 Tacking

AUROC = 100%, AUPR = 100%*

TOOL ANOMALY IDENTIFICATION DEVICE AND METHOD FOR IDENTIFYING TOOL ANOMALIES

TECHNICAL FIELD

Various aspects relate to methods, devices, and non-transitory computer-readable medium for identifying and classifying tool anomalies.

BACKGROUND

A manufacturing process/step, such as a photoresist lamination process/step or a dry-film photoresist lamination process/step associated with printed circuit board (PCB) manufacturing, may involve one or more lamination tools. Such a lamination tool may have an optical encoder configured to count the number of rotations of a shaft to obtain a shaft rotation count. The shaft may be driven by a dry photoresist film which is laminated to a panel. If the shaft rotation count is outside a pre-set or pre-determined range, the photoresist lamination tool produces one or more error/anomaly notifications, typically in the form of a generic error text message, without providing further detail or information relating to the cause of the error. An authorized personnel, for example, a technician or an engineer, may then be required to investigate the issue by watching videos captured by the cameras of a network video recorder (NVR) system.

To assist the authorized personnel, a checklist or flow chart, also referred to as response flow checklist (RFC), may then be used by the authorized personnel to investigate the root cause of the error(s), and to determine an appropriate response. Over time, further expert knowledge contributed by the authorized personnel may be appended to improve the RFC to be more detailed and effective. For example, the RFC may include one or more steps guiding or instructing a relevant technician executing the RFC to get the insight from the anomaly detection script and follow the proposed solution or next step.

Execution of RFC may be a time-consuming process that may increase man-hours to identify one or more root causes associated with the tool error(s). In addition, the tool downtime may inadvertently be lengthened due to delay in root cause identification, hence reducing tool availability.

A need exists to reduce tool downtime, increase tool availability, reduce man-hour spent on troubleshooting, and promptly identify the root causes associated with the lamination tool anomalies to improve factory capacity and meet product schedule.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which.

DESCRIPTION

Figure 1:
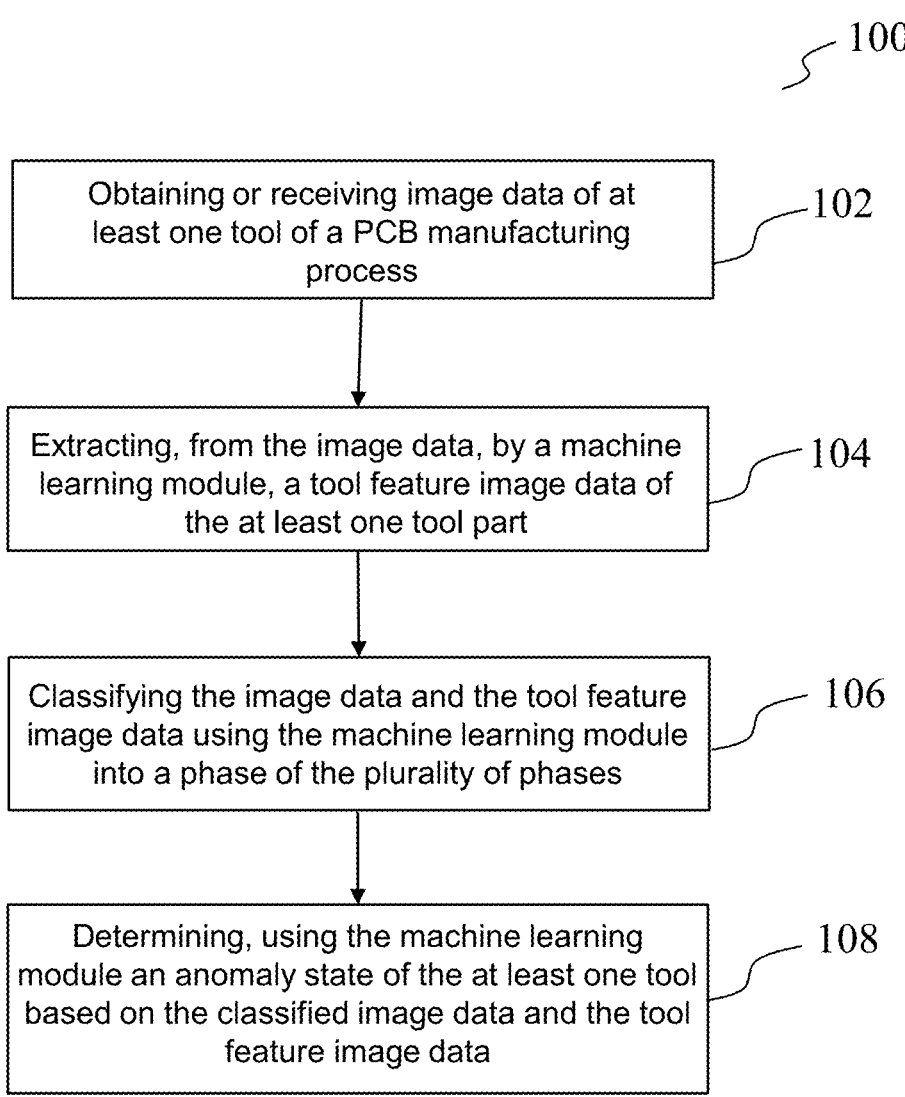
FIG. 1 shows a flow diagram of a method for identifying a tool anomaly of a manufacturing process.

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and/or electrical changes may be made without departing from the scope of the disclosure. The various aspects of the disclosure are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The term "exemplary" may be used herein to mean "serving as an example, instance, or illustration". Any aspect or design described herein as "exemplary" is not necessarily to be construed as preferred or advantageous over other aspects or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and in the claims expressly refer to a quantity greater than one. Accordingly, any phrases explicitly invoking the aforementioned words (e.g., "a plurality of (objects)", "multiple (objects)") referring to a quantity of objects expressly refer to more than one of the said objects. The terms "group (of)", "set (of)", "collection (of)", "series (of)", "sequence (of)", "grouping (of)", etc., and the like in the description and in the claims, if any, refer to a quantity equal to or greater than one, i.e. one or more.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art. Any type of information, as described herein, may be handled for example via one or more processors in a suitable way, e.g. as data.

The terms "processor" or "controller" as, for example, used herein may be understood as any kind of entity that allows handling data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" detailed herein may be understood to include any suitable type of memory or memory device, e.g., a hard disk drive (HDD), a solid-state drive (SSD), a flash memory, etc.

The term "module" detailed herein refers to, or forms part of, or includes an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

Differences between software and hardware-implemented data handling may blur. A processor, controller, and/or circuit detailed herein may be implemented in software, hardware, and/or as a hybrid implementation including software and hardware.

The term "system" (e.g. a machine learning system, a computing system, etc.) detailed herein may be understood as a set of interacting elements, for which the elements can be, by way of example and not of limitation, one or more mechanical components, one or more electrical components, one or more instructions (e.g., encoded in storage media), and/or one or more processors, and the like.

A machine learning module, according to an example of the present disclosure, builds and trains one or more machine learning classifiers, such as convolutional neural networks (CNNs). The machine learning classifiers may accurately and automatically extract image data and perform image processing to detect particular features or attributes of the extracted image data. Examples of such features or attributes may include a tool position, a tool movement, and/or a tool counter of a manufacturing process, such as a printed circuit board (PCB) manufacturing process. In some aspects, the PCB manufacturing process may be an additive manufacturing process, a semi-additive process (SAP), modified semi-additive process (mSAP), a subtractive etch process etc. In some aspects, the PCB manufacturing process may include a dry film lamination process/step. The features or attributes may be used for image matching with a set of reference image date to identify visually similar content. The machine learning classifiers may receive raw images as inputs and output a state associated with the tool. Examples of states include a normal state and an anomaly state.

CNNs may include many layers to detect and classify particular features of images relevant to a problem in hand, for example, to detect one or more tool anomalies in a manufacturing process, such as a dry film lamination manufacturing process for a specific phase of a PCB manufacturing process. Furthermore, each layer of the CNN typically has parameters associated with it. The specific values of those parameters necessary for a successful and accurate image classification may not be known a priori. The machine learning image processing system, according to one or more aspects, provides a method for building and training CNNs to output an accurate classification of an image. Such building and training of the CNNs may include probability distribution modeling and/or deep-feature modeling.

In some aspects, one or more CNNs may be built and trained by the machine learning module to perform feature extraction from an image data. The image data may be provided to the image extraction CNN to identify and extract an image of an object, such as a tool feature/attribute image for a PCB manufacturing process involving a dry film lamination process/step. The extracted image may include a portion of the source image data containing the tool from the source image data. The machine learning image processing system may identify the tool in the target image, create one or more bounding boxes, and crop one or more of the tool from the target image to create extracted images of the tools. In some aspects, the image data may be provided in various file formats, e.g., JPG, GIF, TIFF, PNG, or BMP file formats.

The CNN may be built and trained by the machine learning module to identify one or more attributes or features of the image data. In an example, an extracted image is created using the image extraction CNN, and the image attribute CNN determines the attributes of the extracted image. The attributes of the extracted image may be compared to attributes of stored images to find similar images in an image-matching process. Examples of attributes or features include a tool position, a tool movement, and/or a tool counter. In some aspects, the attributes/features may be high-level abstractions represented by vectors of numeric values that may include visual features of an image.

FIG. 1 shows an example of a method 100 for identifying a tool anomaly of a manufacturing process. The manufacturing process may be a semiconductor manufacturing process, such as a printed circuit board (PCB) manufacturing process comprising various phases such as laminate panel loading, tacking, etc. The method includes the steps of:

Step 102: obtaining or receiving image data of at least one tool of the manufacturing process;

Step 104: extracting, from the image data, using a machine learning module, a tool feature image data of the at least one tool part;

Step 106: classifying, using the machine learning module, the tool feature image data based on a phase of the manufacturing process; and Step 108: determining, using the machine learning module, an anomaly state of the at least one tool based on the classified image data and the tool feature image data.

In step 102, the image data may be acquired from an image sensor, such as an industrial-grade smart camera or a network video recorder (NVR). In some aspects, the image data may include at least one of the following information: a tool or part thereof, the tool position, the tool movement, and a phase of the manufacturing process. The image sensor may be properly aligned or positioned such that the field of view (FOV) is parallelly aligned the respective tool(s), before image data is captured.

In step 104, the machine learning module may be a CNN as described. The machine learning module may include various search algorithms to search and compare the image data with a database which includes one or more reference image data, to determine if there is any tool anomaly. Such tool anomalies may include a wrong positioning of a tool, or be associated with a shaft rotation of a tool outside a preset range.

The extraction of the tool feature may include providing a bounding box (e.g., size and location of bounding box) identifying the location of the tool and/or tool feature in the image data. In some aspects, the extraction of the tool feature may include identifying one or more image coordinates on the image data.

In step 106, the phase may include one of the following phases—a panel arrival phase, a tacking phase, an air blow phase, a panel moves [forward] phase, and a film cut phase. The classifying of the extracted tool feature based on a phase may include receiving the extracted feature and comparing the extracted feature with reference image data already classified based on different phases. For example, a database containing the reference image data may include reference image data tagged or labelled based on specific phases. In an aspect, the image data input to the machine learning module may already be identified based on phase or tagged based on specific features in the image data captured by the image sensors.

In step 108, the determining, based on the classified image data and the tool feature image data, an anomaly state of the at least one tool may include deriving a likelihood score based on a similarity comparison between the phase-classified extracted tool feature image data and that of the reference image data. If the likelihood score is below a certain predetermined threshold, tool anomaly may be determined to be present, and the anomaly state may be assigned to a binary "1". Otherwise, the anomaly state may be assigned a binary "0".

In some aspects, the method may a step of determining a root cause of the anomaly if the anomaly state is determined to indicate a probability of anomaly. The detecting of the root cause of the at least one tool anomaly may include sending the anomaly state, and the image data associated with the anomaly to a response flow checklist.

In some aspects, the machine learning module may be a three-dimensional (3D) CNN, and includes, for example, a number of convolutional and subsampling layers followed by fully connected layers. Probability distributions may be modeled over the feature space of the 3D CNN based on the reference image data, and the likelihood score may be derived based on a similarity comparison between the phase-classified extracted tool part data from the image data and that of the reference image data. Based on the training of the CNN based on the probability distributions, extracted features that are considered normal may be deemed to produce or output relatively higher likelihood scores when compared with the reference image data, while extracted features that deviate from the learnt distribution (such as anomalous or defective inputs) will produce or output lower likelihood scores. The likelihood scores can hence be used to distinguish between good and anomalous data.

In some aspects, the degree of similarity may be quantified and expressed in the form of a normalized likelihood score, where a score of 0.0 indicates no similarity between the extracted tool feature with respect to reference image data, and 1.0 indicating a perfect match. An acceptable threshold may be obtained based on statistical manipulation of historical data.

Figure 2:
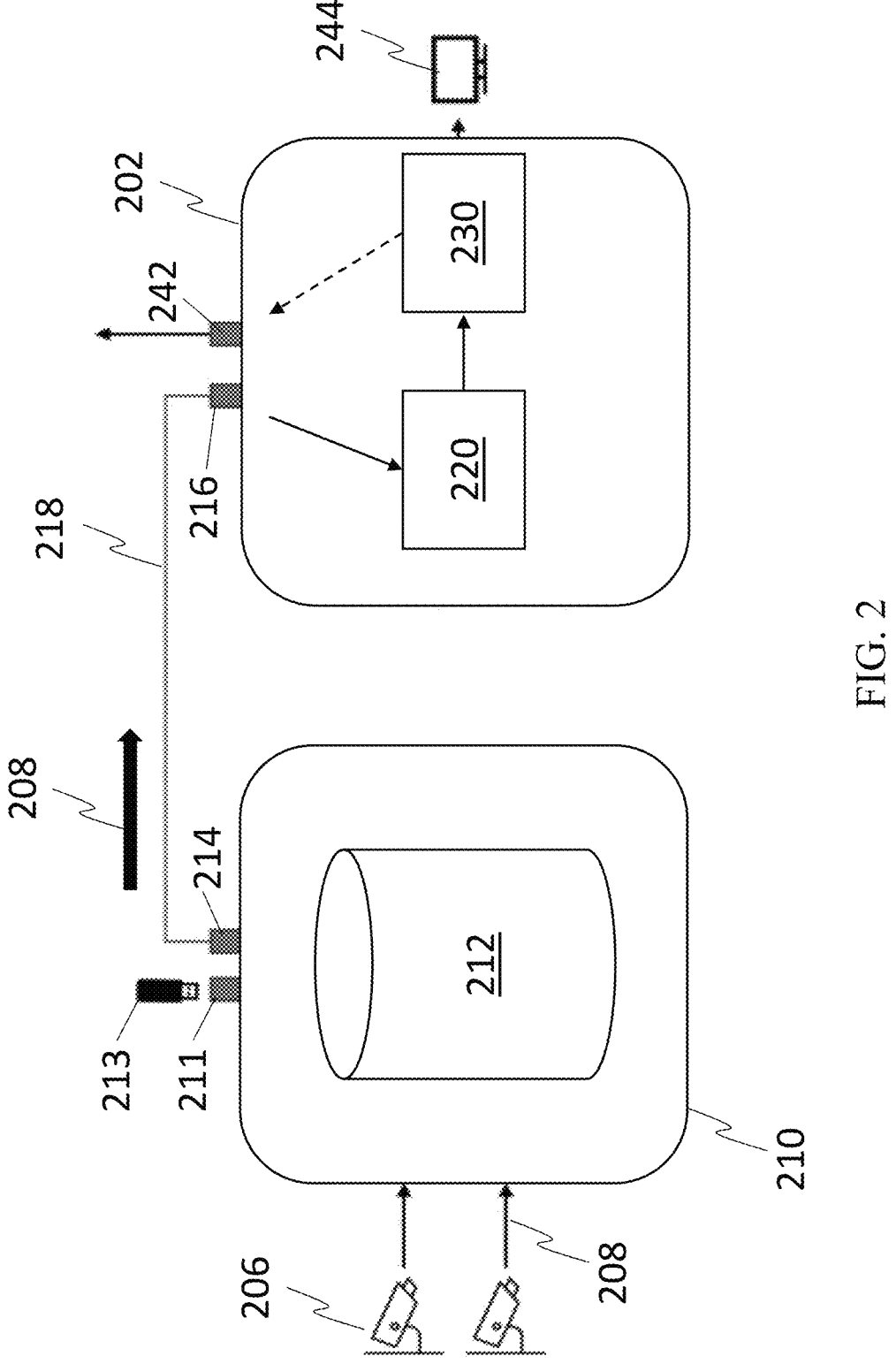
FIG. 2 shows a schematic block diagram of a system for identifying a tool anomaly of a manufacturing process.

FIG. 2 illustrates a schematic block diagram of a system 200 for identifying a tool anomaly of a manufacturing process, such as a PCB manufacturing process involving a dry film lamination process/step. The system 200 includes one or more processors 202; and a memory having instructions stored therein, the instructions, when executed by the one or more processors 202, cause the one or more processors 202 to: obtain image data of at least one tool of the PCB manufacturing process; input the image data to a machine learning module, the machine learning module configured to perform the following steps: extract, from the image data, a tool feature image data of the at least one tool; classify the image data into a phase of the plurality of phases; and determine, based on the classified image data and the tool feature image data, an anomaly state of the at least one tool.

The one or more processors 202 may be configured to pre-process the image data before the prediction of the set of coordinates of the reference point.

The system 200 may include one or more image capturing devices 206 configured to capture a video stream data 208 of the at least one tool of the PCB manufacturing process. The image capturing device(s) 206 may be arranged in data communication with a network video recorder (NVR) 210. The NVR 210 may include a storage database 212 configured as a buffer to store the video stream data 208, i.e. image data, as multiple image frames. The NVR 210 may include an input port 211 configured to receive image data from other sources such as a universal serial bus (USB) drive 213. The NVR 210 may include an output port 214 configured to send image data to the one or more processor 202. The output port 214 may be in the form of an ethernet port configured to send the buffered video stream data 208 to the processor 202 via an input port 216. The output port 214 may be connected with the input port 216 via an Ethernet cable 218.

In some aspects, the processor 202 may include an anomaly detection module 220 configured to execute the method 100, and a notification module 230 configured to receive the output from the anomaly detection for further analysis or action(s). The output may include a result file indicating whether the image data contains a tool anomaly and a root cause of the tool anomaly. The result file may be in the form of a text file having a file format .txt. In some aspects, where the system 200 is applied to a PCB manufacturing process involving a dry film lamination process/step having a tacking phase, either both or one of the films could get separated from a tacking plate right before the tacking step, thus causing failed tacking on one or both sides of a laminate panel. The root cause may be inadequate or insufficient vacuum pressure in the tacking plate due to issues with one or more valve(s), a line, or one or more vacuum pumps. Such an anomaly can be detected by the lamination tool and based on timing and location a properly trained model may identify the root cause as low vacuum pressure at the upper and/or lower tacking plate.

In some aspects, the notification module 230 may be configured to update a response flow checklist based on the identified root cause. The update may be in the form of modifying the response flow checklist to include one or more action steps, and/or changing of one or more operational parameters within the response flow checklist.

In some aspects, the processor 202 includes an output port 242 for remote access to a third-party network. The root cause of the identified anomalies may be sent to the third-party network for further action.

In some aspects, the notification module 230 may be connected to a client terminal 244 for display of the anomalies and associated root cause(s).

Figure 3:
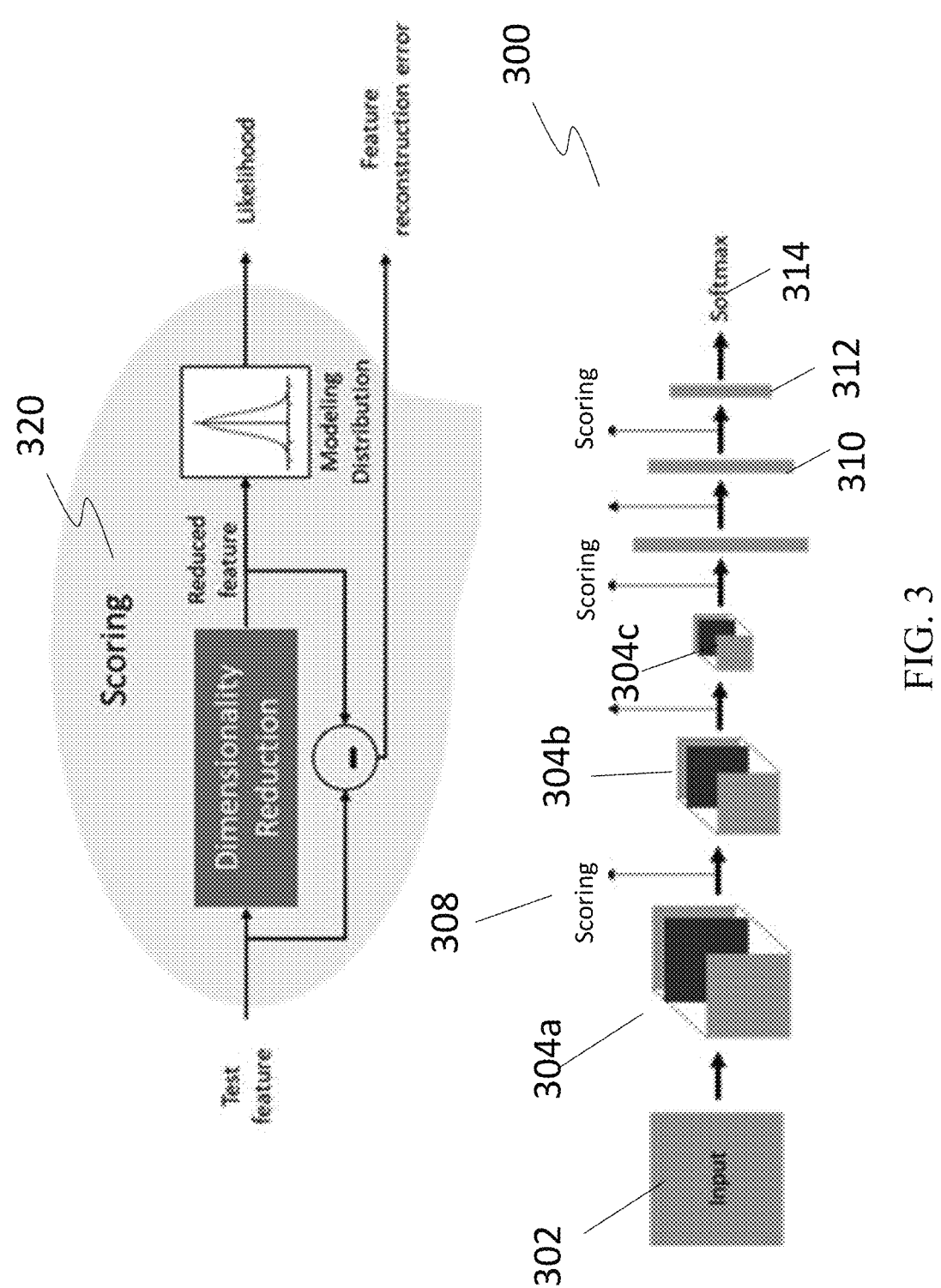
FIG. 3 shows a schematic block diagram of a deep feature module in use to infer or predict a tool anomaly of a manufacturing process.

FIG. 3 shows another aspect of the present disclosure in the form of a schematic block diagram of the deep feature module 300 in use to infer or predict a tool anomaly of a PCB manufacturing process. The deep feature module 300 may include a CNN having multiple layers as described. The deep feature module 300 may be part of the anomaly detection module 220 as described. In other words, the anomaly detection module 220 may include the deep feature module 300.

The image data 302 is input into the CNN which may include multiple layers 304 for feature learning, each layer 304*a*, 304*b*, 304*c* configured to detect different features of the image data 302. A filter or kernel may be applied to the image data 302 to produce an output in the form of a plurality of scores 308. Each score 308 is sent to the next layer to further facilitate the next stage in recognition of the image data 302. In some aspects, each feature learning layer may include a convolutional layer and a pooling layer.

After the feature learning layers, the feature data may then go through a flattened layer 310, a fully-connected layer 312, before the output using softmax function 314. The softmax function 314 is programmed to provide an output between 0.0 and 1.0.

In some aspects, the output score of each layer of the CNN is generated using a per-class parametric probability distribution model 320 as illustrated. In the model 320, a test feature, which may be image data, undergoes a dimensionality reduction before a reduced feature is generated. The test feature is compared with the reduced feature to calculate a feature reconstruction error. The reduced feature is in turn input into a parametric probability distribution which is used to derive the likelihood score.

The above-mentioned approach may be also referred to as deep-feature modeling (DFM).

Figure 4:
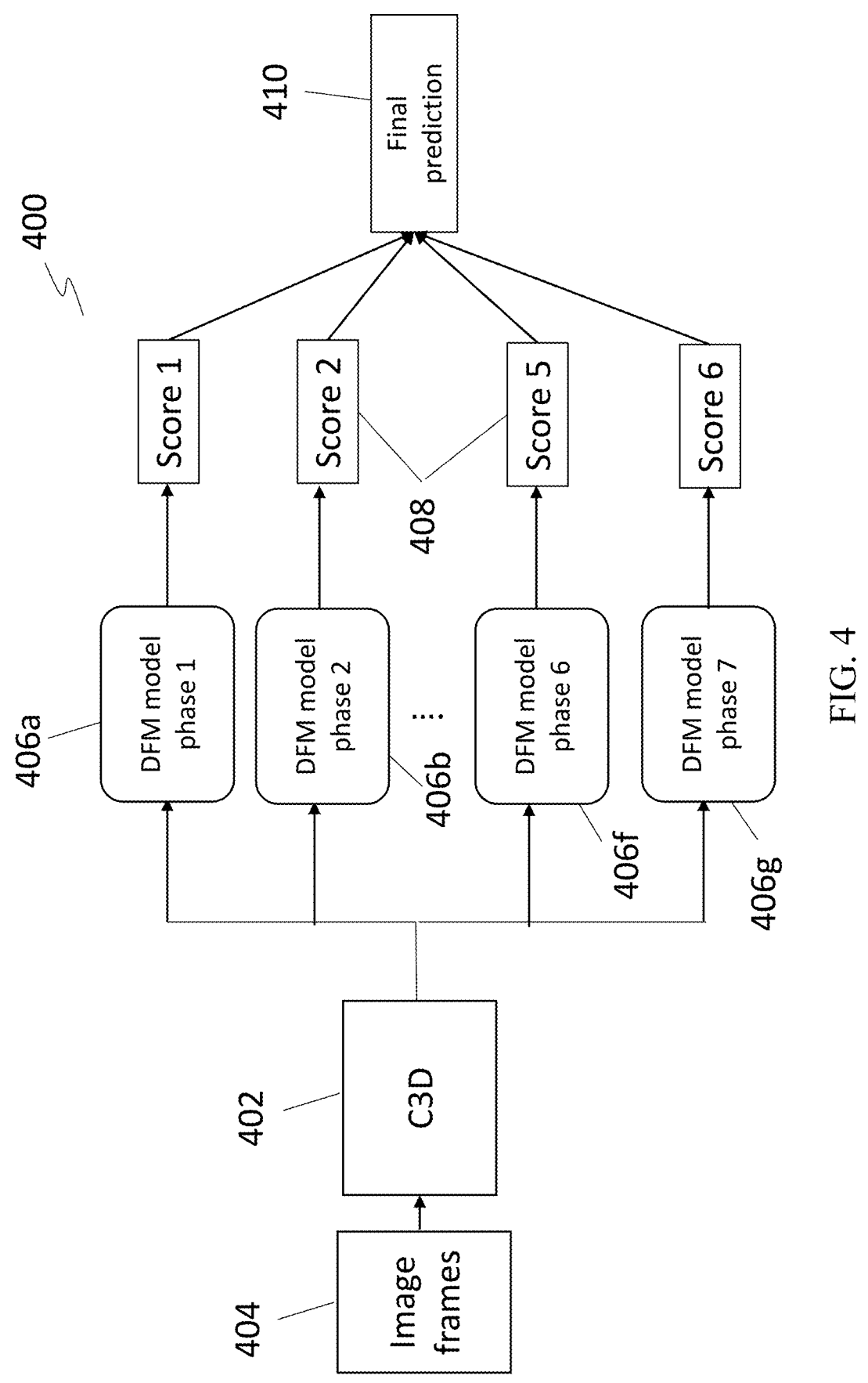
FIG. 4 shows a flow diagram of simultaneous phase and anomaly detection of a tool anomaly of a manufacturing process using multiple deep feature modules, each deep feature module associated with a phase of the manufacturing process.

FIG. 4 shows another aspect where a separate deep-feature model is learnt for each phase of a PCB manufacturing process as shown in FIG. 3. The setup 400 of FIG. 4 shows 3D CNN 402 configured to receive image data 404. The image data 404 may be in the form of a sequence of rolling sixteen-frames images with eight-frame overlap. The output of the 3D CNN 402 may be the extracted tool feature image data which may be sent to a plurality of deep feature models (DFM) 406*a*, 406*b*, 406*f*, 406*g*, each deep feature model 406 corresponding to a phase of the PCB manufacturing process. It is appreciable each DFM 406*a*, 406*b*, 406*f*, 406*g* implements a deep feature module 300 as described. The output of the deep feature model 406 includes a plurality of likelihood scores 408. The plurality of likelihood scores are used to derive an argument maximum likelihood score and a maximum likelihood score from a plurality of likelihood scores, each of the plurality of likelihood scores corresponding to one of the plurality of phases. The argument maximum likelihood score and the maximum likelihood score are then used for the final prediction 410 of a phase and anomaly detection. The final prediction may include further steps such as temporal filtering (to predict the phase) and phase-based thresholding (to predict the anomaly state).

It is contemplated that a good, anomaly-free input image data from any phase of the addictive manufacturing operation may cause the likelihood score for the corresponding DFM model to be high, which can then be used to identify the phase of operation. If an image data contains an anomalous tool feature, then all the DFM models will produce low likelihood scores and the image data can then be flagged as defective.

In another aspect, where the image data model operates continuously on a rolling window of 16 input frames, a time (corresponding to a 16-frame segment) that an anomaly occurs can be derived or calculated.

In the present disclosure, the image data may be obtained from panel process videos which are captured from the tool and subsequently analyzed using the machine learning module. The present disclosure can also be extended to use lamination defect detection in a panel immediately after processing. The present disclosure can also be extended for anomaly and error identification in other tools and defect identification during other processes.

It is envisaged the present disclosure may reduce human intervention and subsequent delay in root cause identification. It will help improve tool response flow checklist and reduce repeated events. As a result, the tool availability and line yield will improve.

In some aspects, the training of the described machine learning module may include a selection of input set, the input set including image data captured during one or more actual manufacturing processes. The input set may include a training set and a test set. In some aspects, 80% of the image data captured during the actual manufacturing process is used as training image set, and 20% of the image data is used as test image set.

In some aspects, the training process may include a supervised, an un-supervised, or a hybrid learning process.

In some aspects, the machine learning module 220 may include a genetic algorithm, an evolutionary algorithm, a fuzzy logic algorithm, an expert-rule based model, or one or more combinations of the aforementioned algorithms.

Figure 5:
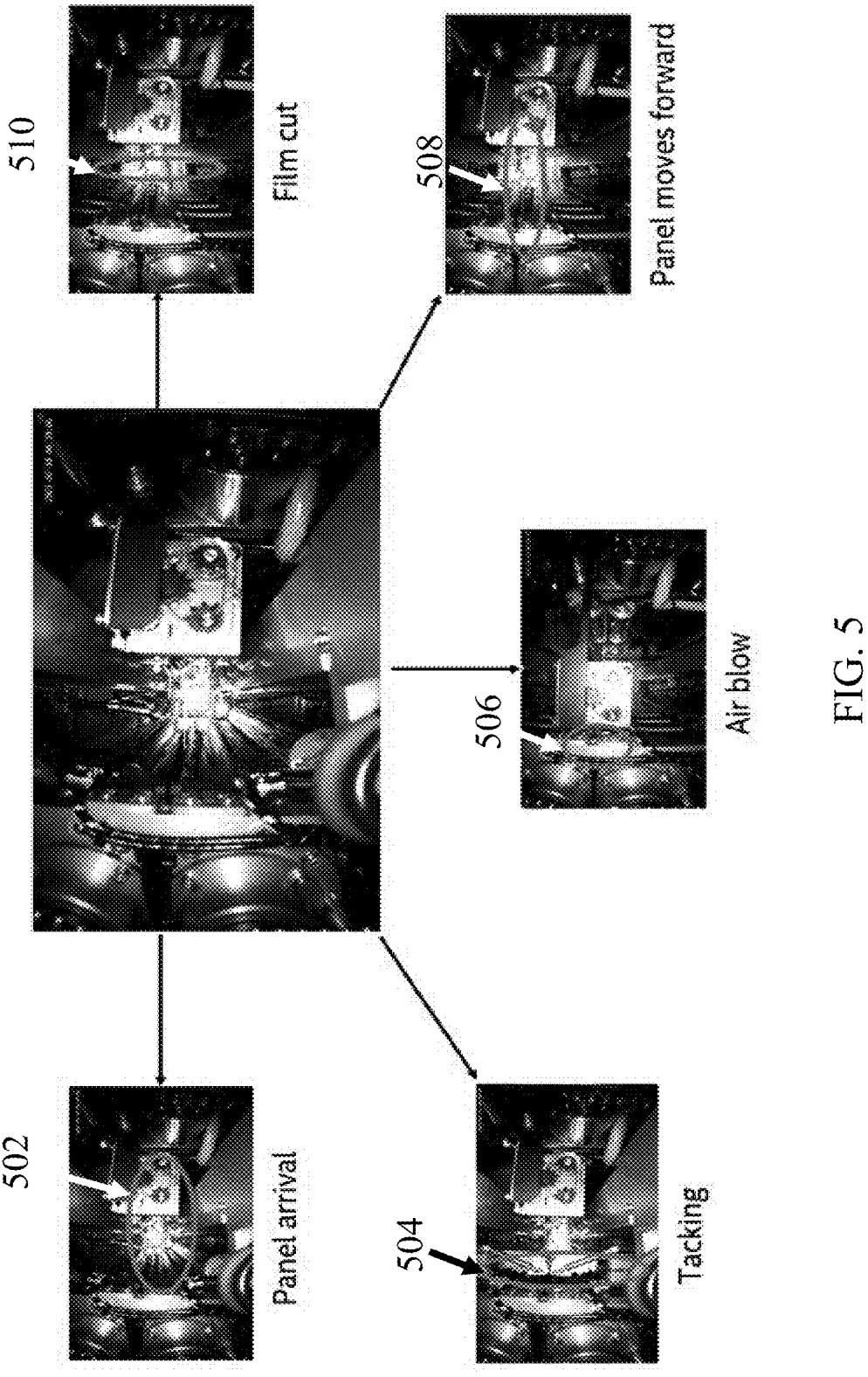
FIG. 5 shows an illustration of various phase detection based on image data of a manufacturing process in the form of a photoresist lamination process/step.

FIG. 5 illustrates the method 100 or system 200 of the present disclosure used for automatic phase detection of five different phases of a dry film lamination or photoresist lamination process/step. The extracted tool feature image data of at least one tool are marked as 502 (for panel arrival phase), 504 (for tacking phase), 506 (for air blow phase), 508 (for panel move forward phase), 510 (for film cut phase).

Figure 6A:
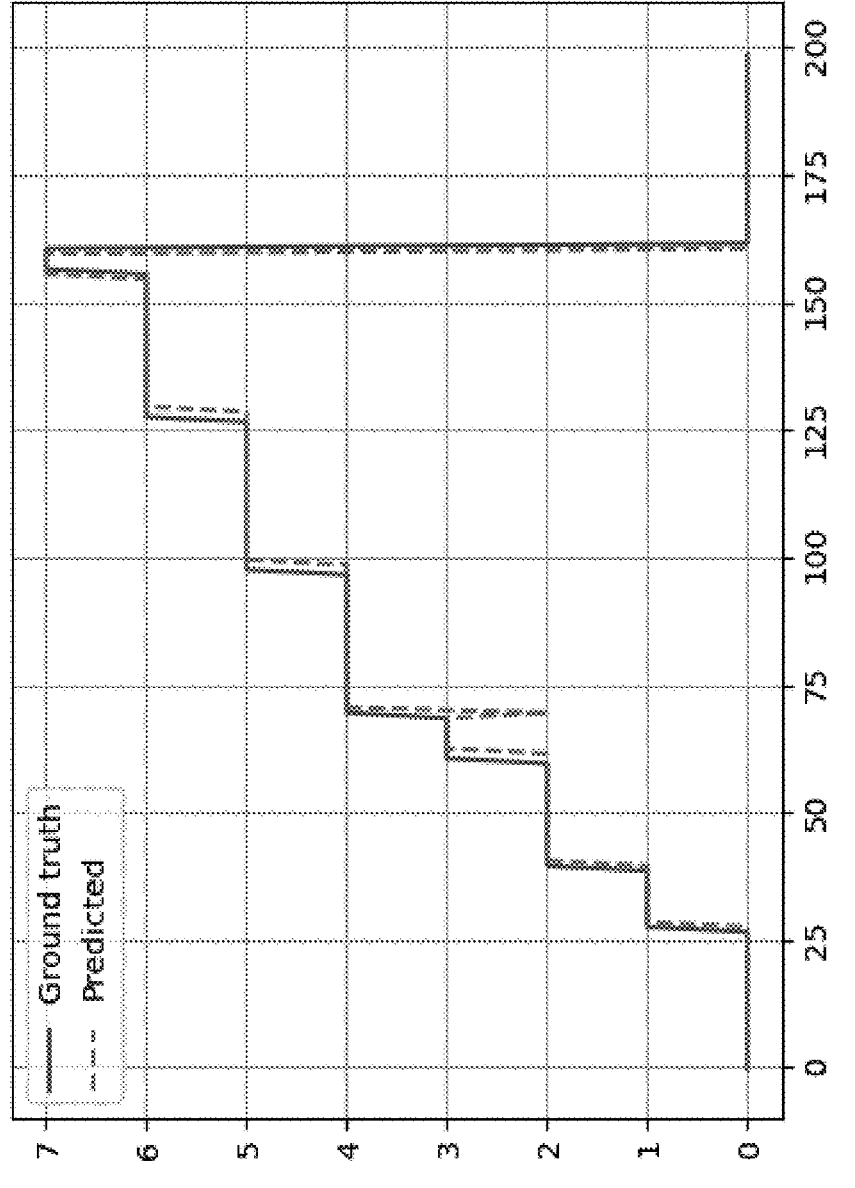
FIGS. 6A and 6B are results demonstrating the efficacy of the method for classifying a phase of the manufacturing process and for identifying tool anomalies respectively.

FIG. 6A shows the predicted results obtained for phase detection of a photoresist lamination process/step using the method 100. The results indicate for three different phases, the predicted phases achieve an accuracy of 94.93% to 95.50%

Figure 6B:
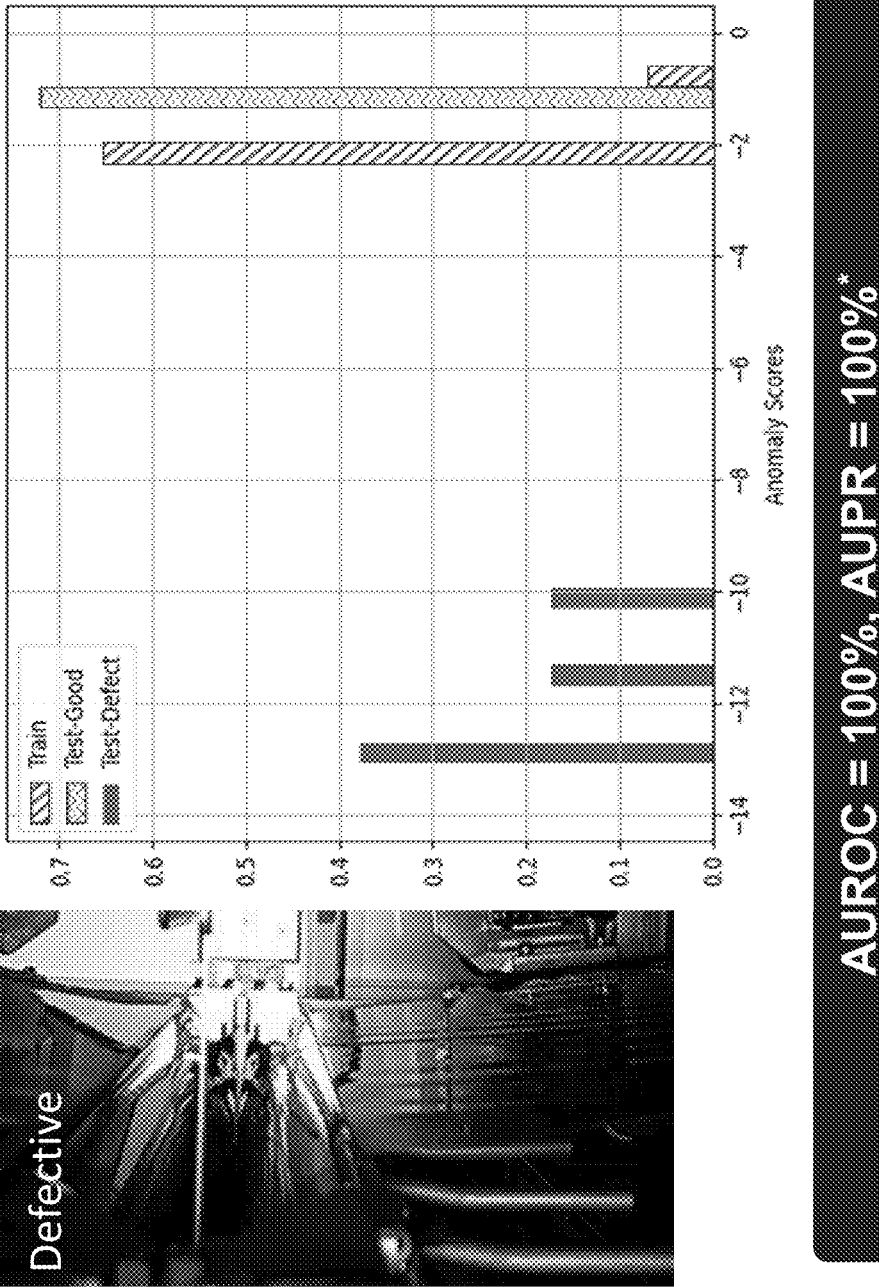
Figure 6B:
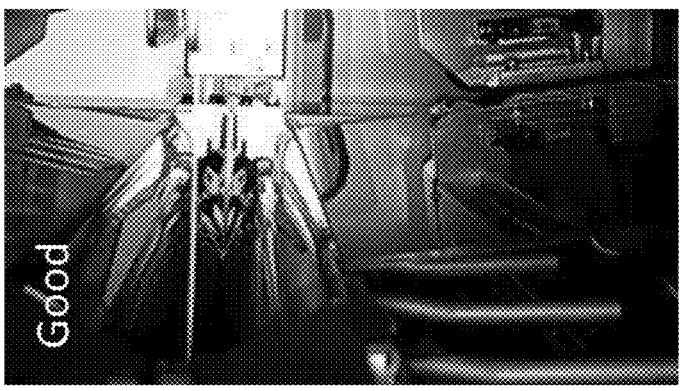

FIG. 6B shows the predicted results of detecting tool anomaly based on the method 100. The results indicate an Area Under the Receiver Operating Characteristics (AU-ROC) and Area Under Precision Recall (AUPR) of 100%.

The following examples pertain to further exemplary implementations.

Example 1 is a method for identifying a tool anomaly of a PCB manufacturing process including a plurality of phases, the method including the steps of: obtaining image data of at least one tool of the PCB manufacturing process; extracting, from the image data, using a machine learning module, a tool feature image data of the at least one tool; classifying the image data and the tool feature image data using the machine learning module into a phase of the plurality of phases; and determining, using the machine learning module, based on the classified image data and the tool feature image data, an anomaly state of the at least one tool.

In Example 2, the method further includes a step of determining a root cause of the anomaly if the anomaly state is determined to indicate a probability of anomaly.

In Example 3, the machine learning module includes a three-dimensional (3D) convolutional neural network module.

In Example 4, classifying the image data into a phase of the plurality of phases includes sending at least one of the image data and the tool feature image data to a deep feature model to generate a likelihood score.

In Example 5, in which the identifying of at least one tool anomaly includes a step of comparing the likelihood score with a threshold.

In Example 6, in which the anomaly state of the at least one tool is indicated to be present if the likelihood score is less than the threshold.

In Example 7, in which the method further includes deriving an argument maximum likelihood score and a maximum likelihood score from a plurality of likelihood scores, each of the plurality of likelihood scores corresponding to one of the plurality of phases.

In Example 8, the method further includes exporting the at least one tool anomaly to a response flow checklist.

In Example 9, the method further includes training the machine learning module based on a training data set and a supervised learning model.

In Example 10, the image data includes a video stream file, the video stream file including a plurality of image frames.

In Example 11, the method further includes buffering the video stream file and sending the buffered image frames to the machine learning module based on a predetermined number of image frame interval.

In Example 12, the PCB manufacturing process includes a dry film lamination process/step and/or a photoresist lamination process/step.

In Example 13, the phase is at least one of a panel arrival phase, a tacking phase, an air blow phase, a film cut phase, and a panel move forward phase.

In Example 14, the classifying of the image data and the tool feature image data into a phase of the plurality of phases; and determining, based on the classified image data and the tool feature image data, an anomaly state of the at least one tool, are performed simultaneously.

Example 15 is a system for identifying a tool anomaly of a PCB manufacturing process, the device includes: one or more processors; and a memory having instructions stored therein, the instructions, when executed by the one or more processors, cause the one or more processors to: obtain image data of at least one tool of the PCB manufacturing process; input the image data to a machine learning module, the machine learning module configured to perform the following steps: extract, from the image data, a tool feature image data of the at least one tool; classify the image data into a phase of the plurality of phases; and determine, based on the classified image data and the tool feature image data, an anomaly state of the at least one tool.

In Example 16, the one or more processors is further configured to determine a root cause of the anomaly if the anomaly state is determined to indicate a probability of anomaly.

In Example 17, the machine learning module includes a three-dimensional (3D) convolutional neural network module.

In Example 18, the one or more processors is configured to derive an argument maximum likelihood score and a maximum likelihood score from a plurality of likelihood scores, each of the plurality of likelihood scores corresponding to one of the plurality of phases.

In Example 19, the system further includes an image capturing device configured to capture a video stream file of the at least one tool of the PCB manufacturing process.

Example 20 is a non-transitory computer-readable medium storing computer executable code including instructions, which, if executed, cause one or more processors to: obtain image data of at least one tool of the PCB manufacturing process; input the image data to a machine learning module, the machine learning module configured to perform the following steps: extract, from the image data, a tool feature image data of the at least one tool; classify the image data into a phase of the plurality of phases; and determine, based on the classified image data and the tool feature image data, an anomaly state of the at least one tool.

It should be noted that one or more of the features of any of the examples above may be combined with any one of the other examples.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A method for identifying a tool anomaly of a printed circuit board (PCB) manufacturing process comprising a plurality of phases, the method comprising the steps of:
  loading at least one laminate panel;
  performing a manufacturing operation on the at least one laminate panel with at least one tool applied in a phase of the PCB manufacturing process;
  obtaining image data of the at least one tool of the PCB manufacturing process indicative of the at least one tool performing the manufacturing operation in the phase of the PCB manufacturing process;
  extracting, from the image data, using a machine learning model, a tool feature image data of the at least one tool;
  classifying the image data and the tool feature image data using the machine learning model into a phase of the plurality of phases;
  determining, using deep-feature modeling in connection with the machine learning model and based on the classified image data and the tool feature image data, a prediction of the phase of the PCB manufacturing process associated with an anomaly state of the at least one tool; and
  determining a root cause of the tool anomaly based on a probability of the tool anomaly, phase timing, the determined prediction and a location of the at least one tool.

2. The method of claim 1, wherein the machine learning model comprises a three-dimensional convolutional neural network.

3. The method of claim 2, wherein the classifying the image data into a phase of the plurality of phases comprises sending at least one of the image data and the tool feature image data to a deep feature model to generate a likelihood score.

4. The method of claim 3, further comprising comparing the likelihood score with a threshold.

5. The method of claim 4, wherein the anomaly state of the at least one tool is indicated to be present if the likelihood score is less than the threshold.

6. The method of claim 1, further comprising deriving an argument maximum likelihood score and a maximum likelihood score from a plurality of likelihood scores, each of the plurality of likelihood scores corresponding to one of the plurality of phases.

7. The method of claim 1, further comprising exporting the tool anomaly to a response flow checklist.

8. The method of claim 1, further comprising training the machine learning model based on a training data set and a supervised learning model.

9. The method of claim 1, wherein the image data comprises a video stream file, the video stream file comprising a plurality of image frames.

10. The method of claim 9, further comprises buffering the video stream file and sending the buffered image frames to the machine learning model based on a predetermined number of image frame intervals.

11. The method of claim 1, wherein the PCB manufacturing process comprises a dry film lamination process or a photoresist lamination process.

12. The method of claim 11, wherein the phase is at least one of a panel arrival phase, a tacking phase, an air blow phase, a film cut phase, and a panel move forward phase.

13. The method of claim 1, wherein the classifying of the image data and the tool feature image data into a phase of the plurality of phases and the determining, based on the classified image data and the tool feature image data, of the prediction are performed simultaneously.

14. A system for identifying a tool anomaly of a PCB manufacturing process, the system comprising:
   one or more processors; and
   a non-transitory computer readable memory having instructions stored therein, the instructions, when executed by the one or more processors, cause the one or more processors to:
   control a loading tool to load at least one laminate panel;
   perform a manufacturing operation on the at least one laminate panel with at least one tool;
   obtain image data of at least one tool of the PCB manufacturing process; and
   input the image data to a machine learning model, the machine learning model configured to perform the following steps:
      extract, from the image data, a tool feature image data of the at least one tool;
      classify the image data into a phase of a plurality of phases;

determine, using deep-feature modeling in connection with the machine learning model and based on the classified image data and the tool feature image data, a prediction of a phase of the PCB manufacturing process associated with an anomaly state of the at least one tool; and
      determine a root cause of the tool anomaly based on a probability of the tool anomaly, phase timing, the determined prediction and a location of the at least one tool.

15. The system of claim 14, wherein the machine learning model comprises a three-dimensional convolutional neural network.

16. The system of claim 14, wherein the three-dimensional convolutional neural network comprises one or more feature layers, wherein each of the one or more feature layers of the three-dimensional convolutional neural network is configured to derive an argument maximum likelihood score and a maximum likelihood score from a plurality of likelihood scores, each of the plurality of likelihood scores corresponding to one of the plurality of phases.

17. The system of claim 14, further comprises an image capturing device configured to capture a video stream file of the at least one tool of the PCB manufacturing process.

18. A non-transitory computer-readable medium storing computer executable code comprising instructions, which, if executed, cause one or more processors to:
   control a loading tool to load at least one laminate panel;
   perform a manufacturing operation on the at least one laminate panel with at least one tool;
   obtain image data of at least one tool of a PCB manufacturing process;
   input the image data to a machine learning model, the machine learning model configured to perform the following steps:
      extract, from the image data, a tool feature image data of the at least one tool;
      classify the image data into a phase of a plurality of phases;
      determine, using deep-feature modeling in connection with the machine learning model and based on the classified image data and the tool feature image data, a prediction of a phase of the PCB manufacturing process associated with a tool anomaly state of the at least one tool; and
      determine a root cause of the tool anomaly state based on a probability of the tool anomaly state, phase timing, the determined prediction and a location of the at least one tool.

* * * * *